(12) United States Patent
Xie et al.

(10) Patent No.: US 12,158,887 B2
(45) Date of Patent: Dec. 3, 2024

(54) ON-BOARD DATA STORAGE METHOD AND SYSTEM

(71) Applicant: ZHIXIE HUITONG (BEIJING) TECHNOLOGY CO., LTD., Beijing (CN)

(72) Inventors: Ning Xie, Beijing (CN); Tao Wang, Beijing (CN)

(73) Assignee: ZHIXIE HUITONG (BEIJING) TECHNOLOGY CO., LTD., Beijing (CN)

(*) Notice: Subject to any disclaimer, the term of this patent is extended or adjusted under 35 U.S.C. 154(b) by 29 days.

(21) Appl. No.: 18/003,466

(22) PCT Filed: Jun. 24, 2020

(86) PCT No.: PCT/CN2020/098216
§ 371 (c)(1),
(2) Date: Dec. 27, 2022

(87) PCT Pub. No.: WO2021/258360
PCT Pub. Date: Dec. 30, 2021

(65) Prior Publication Data
US 2023/0252029 A1    Aug. 10, 2023

(51) Int. Cl.
G06F 16/2457    (2019.01)
G06F 16/23      (2019.01)
G06F 16/27      (2019.01)

(52) U.S. Cl.
CPC .... *G06F 16/24573* (2019.01); *G06F 16/2322* (2019.01); *G06F 16/278* (2019.01)

(58) Field of Classification Search
None
See application file for complete search history.

(56) References Cited

U.S. PATENT DOCUMENTS

| 2004/0098390 | A1  | 5/2004 | Bayliss et al. |
| 2009/0150426 | A1* | 6/2009 | Cannon ................... G06F 40/18 |
| | | | 707/999.102 |

(Continued)

FOREIGN PATENT DOCUMENTS

| CN | 106648446 A | 5/2017 |
| CN | 107451176 A | 12/2017 |

(Continued)

OTHER PUBLICATIONS

International Search Report issued Mar. 22, 2021, in PCT/CN2020/098216 (with English Translation), 6 pages.

(Continued)

*Primary Examiner* — Kannan Shanmugasundaram
(74) *Attorney, Agent, or Firm* — Oblon, McClelland, Maier & Neustadt, L.L.P.

(57) ABSTRACT

This invention is directed to an on-board data storage method and system. The on-board data storage method includes obtaining, in a current time period, various pieces of time sequence data to be processed written into the on-board database; for each piece of the time sequence data to be processed, determining a node to be stored in the on-board database and a partition to be stored in the node according to the piece of the time sequence data to be processed, and writing the piece of the time sequence data to be processed into a corresponding time sequence in the determined partition to be stored; and writing each piece of the time sequence data written into each partition to be stored into each corresponding data bucket in memory.

20 Claims, 4 Drawing Sheets

(56) References Cited

U.S. PATENT DOCUMENTS

| | | | | |
|---|---|---|---|---|
| 2009/0300039 | A1* | 12/2009 | Stengelin | ............... H03M 7/30 707/E17.005 |
| 2015/0081719 | A1 | 3/2015 | Ray et al. | |
| 2015/0379050 | A1* | 12/2015 | Yanacek | ............ G06F 16/2282 707/805 |
| 2017/0344619 | A1 | 11/2017 | Kim | |

FOREIGN PATENT DOCUMENTS

| | | | |
|---|---|---|---|
| CN | 106648446 | * | 5/2018 |
| CN | 108021650 A | | 5/2018 |
| CN | 110825733 A | | 2/2020 |
| JP | 2006-195788 A | | 7/2006 |
| JP | 2019-133650 A | | 8/2019 |

OTHER PUBLICATIONS

Extended European Search Report issued Jan. 30, 2024, in corresponding European Patent Application No. 20941877.1, 11 pages.

Office Action issued Mar. 28, 2024, in corresponding Japanese Patent Application No. 2022-580360 (with English Translation), 6 pages.

\* cited by examiner

ON-BOARD DATA STORAGE METHOD AND SYSTEM

CROSS-REFERENCE TO RELATED APPLICATIONS

The present disclosure is a U.S. National Stage Application under 35 U.S.C. § 371 of International Patent Application No. PCT/CN2020/098116, filed on Jun. 24, 2020, which is based on and claims priority of Chinese application for invention No. 202080009529.3, filed on Jun. 24, 2020, the disclosure of which is hereby incorporated into this disclosure by reference in its entirety.

TECHNICAL FIELD

The present invention relates to the technical field of data storage, in particular to an on-board data storage method and system.

BACKGROUND

The on-board database mainly stores time sequence data, and the stored raw data is in a very large amount. A lot of computing resources and time will be consumed if the original data is directly queried from the on-board database for analysis and calculation, and the on-board device can provide limited computing resources, which results in that the on-board device cannot response to other requests in time. In addition, since the on-board hard disk has a limited capacity, when a large amount of raw data is written into the on-board hard disk with high frequency, it is possible to fully occupy the capacity of the hard disk, which lead to a breakdown of the devices within the vehicle. However, if all the raw data is transmitted back to the cloud for analysis and calculation, the bandwidth cannot meet the requirement of real-time transmission due to a huge amount of data.

SUMMARY

In the present invention, a storage method of on-board data is provided, wherein the storage method is used for an on-board database, the method comprising the steps of:
  obtaining, in a current time period, various pieces of time sequence data to be processed written into the on-board database;
  for each piece of the time sequence data to be processed, determining a node to be stored in the on-board database and a partition to be stored in the node according to the piece of the time sequence data to be processed, and writing the piece of the time sequence data to be processed into a corresponding time sequence in the determined partition to be stored; and
  writing the each piece of the time sequence data written into the each partition to be stored into each corresponding data bucket in memory respectively and merging the time sequence data in each data bucket in memory.

As a further improvement of the present invention, for each piece of the time sequence data to be processed, determining a node to be stored in the on-board database and a partition to be stored in the node according to the piece of the time sequence data to be processed, and writing the piece of the time sequence data to be processed into a corresponding time sequence in the determined partition to be stored comprises:
  for the each piece of the time sequence data,
  determining a hash value corresponding to a key of the piece of the time sequence data to be processed; and
  determining the node to be stored corresponding to the piece of the time sequence data to be processed, the partition to be stored in the node to be stored and a corresponding time sequence of the partition to be stored according to the hash value, and writing the piece of the time sequence data to be processed into the corresponding time sequence in the partition to be stored.

As a further improvement of the present invention, the writing the each piece of the time sequence data written into the each partition to be stored into each corresponding data bucket in memory respectively and merging the time sequence data in each data bucket in memory comprises:
  for each time sequence in each partition to be stored, writing the each piece of the time sequence data written into the time sequence within the current time period into a data bucket in memory corresponding to the time sequence; and
  for the each data bucket in memory, merging each piece of the time sequence data written into the data bucket in memory.

As a further improvement of the present invention, the writing the each piece of the time sequence data written into the each partition to be stored into each corresponding data bucket in memory respectively and merging the time sequence data in each data bucket in memory comprises:
  compressing the each piece of the time sequence data to be processed respectively according to a time stamp difference and an index value difference between various pieces of the time sequence data to be processed; and
  writing the compressed each piece of the time sequence data to be processed into a corresponding time sequence in a corresponding partition to be stored respectively.

As a further improvement of the present invention, the compressing the each piece of the time sequence data to be processed respectively according to a time stamp difference and an index value difference between various pieces of the time sequence data to be processed comprises:
  for the each partition to be stored:
  writing a first piece of time sequence data to be processed into the partition to be stored;
  determining a first time stamp difference and a first index value difference between a second piece of time sequence data to be processed and the first piece of time sequence data to be processed written into the partition to be stored, and storing the first time stamp difference and the first index value difference as a compressed second piece of time sequence data in the partition to be stored;
  determining a second time stamp difference and a second index value difference between the third piece of time sequence data to be processed and the second piece of time sequence data to be processed written into the partition to be stored, determining a third time stamp difference between the second time stamp difference and the first time stamp difference and a third index value difference between the second index value difference and the first index value difference, and storing the third time stamp difference and the third index value difference as a compressed third piece of time sequence data in the partition to be stored.

As a further improvement of the present invention, each time stamp difference and each index value difference are represented and stored by different coding methods.

As a further improvement of the present invention, for the each time stamp difference and the each index value difference:
a corresponding coding method is determined according to the time stamp difference and the index value difference;
the time stamp difference or the index value difference is represented and stored by a first coding method in a case where the time stamp difference or the index value difference is greater than or equal to a first value and less than a second value; and
the time stamp difference or the index value difference is represented and stored by a second coding method in a case where the time stamp difference or the index value difference is greater than or equal to the second value and less than a third value.

As a further improvement of the present invention, the storage method further comprises:
determining merged time sequence data to be processed that is written into an on-board hard disk, wherein the merged time sequence data to be processed comprises the merged time sequence data in the each data bucket in memory; and
writing the merged time sequence data to be processed into the on-board hard disk.

As a further improvement of the present invention, the writing the merged time sequence data to be processed into the on-board hard disk comprises:
compressing the merged time sequence data to be processed into data blocks and writing each of the data blocks into the on-board hard disk.

As a further improvement of the present invention, the storage method further comprises:
determining time sequence data to be recorded comprising remaining time sequence data after the merged time sequence data in the each data bucket in memory is written into the on-board hard disk and the remaining time sequence data of each time sequence in each partition to be stored;
recording log information of the time sequence data to be recorded, and determining whether the log information is written into the on-board hard disk and a writing frequency of the log information; and
writing the log information into the on-board hard disk at the writing frequency in a case where it is determined that the log information is written into the on-board hard disk.

As a further improvement of the present invention, the storage method further comprises:
determining time sequence data to be deleted in the on-board hard disk according to a storage time; and
deleting the time sequence data to be deleted to write the merged time sequence data to be processed into the on-board hard disk.

As a further improvement of the present invention, the storage method further comprises:
determining summary data of each time sequence in each node to be stored; and
storing the summary data of each time sequence according to a summary tree respectively to read the summary data of each time sequence from the memory, wherein the memory comprises various time sequences, various data buckets in memory and various summary trees, wherein each summary tree comprises a root node and multiple layers of nodes from top to bottom, each of which stores the summary data of a time sequence corresponding to the summary tree within a time interval.

As a further improvement of the present invention, the storing the summary data of each time sequence according to a summary tree respectively comprises:
for the summary tree of each time sequence: for each node in the nth layer of the nodes, determining a mth time interval represented by the node, and storing the summary data of the time sequence data in the time sequence calculated within the mth time interval into the node.

As a further improvement of the present invention, each node in the each summary tree stores an offset from a start time of a parent node to a start time of a current node respectively, and a start time of a time interval represented by the current node is determined by the start time of the parent node and the offset from the start time of the parent node to the start time of the current node.

As a further improvement of the present invention, the storage method further comprises:
writing the each summary tree into the on-board hard disk to query the summary data of the each time sequence from the on-board hard disk,
wherein a hard disk file corresponding to the each summary tree comprises a file header part and a data part, the file header part comprises a key of the time sequence corresponding to the summary tree and the time interval corresponding to the each node of the summary tree, and the data part comprises the summary data stored by each node of the summary tree.

As a further improvement of the present invention, the storage method further comprises:
determining a time interval to be queried and a key of the time sequence corresponding to a summary data to be queried;
searching the hard disk file corresponding to the summary data to be queried from the on-board hard disk according to the key of the time sequence corresponding to the summary data to be queried;
loading the summary tree corresponding to the summary data to be queried from the hard disk file; and
matching from a parent node of the summary tree corresponding to the summary data to be queried, traversing multiple layers of nodes of the summary tree corresponding to the summary data to be queried layer by layer until one or more nodes corresponding to the time interval to be queried are found to obtain the summary data from one or more nodes corresponding to the time interval to be queried.

As a further improvement of the present invention, obtaining the summary data from one or more nodes corresponding to the time interval to be queried comprises:
obtaining the summary data of a node in a layer of nodes in the summary tree corresponding to the summary data to be queried, and taking the summary data of the node in the layer of nodes as a query result in a case that the time interval to be queried comprises one node; and
obtaining the summary data of a plurality of nodes in a layer of nodes in the summary tree corresponding to the summary data to be queried respectively, and merging the summary data of the plurality of nodes in a case that the time interval to be queried comprises the plurality of nodes, wherein the merged summary data is taken as the query result.

As a further improvement of the present invention, obtaining the summary data from one or more nodes corresponding to the time interval to be queried comprises:

discarding the summary data of an upper boundary node and a lower boundary node in a layer of nodes of the summary tree corresponding to the summary data to be queried, and retaining the summary data of nodes other than the upper boundary node and the lower boundary node in the layer of nodes of the summary tree corresponding to the summary data to be queried in a case that the time to be queried does not completely cover the nodes in the layer of nodes of the summary tree corresponding to the summary data to be queried.

In this invention, a storage system of on-board data is further provided, wherein the storage system is used for an on-board database, comprising:

a data obtaining module for obtaining, in a current time period, various pieces of time sequence data to be processed written into the on-board database;

a data writing module for: for each piece of the time sequence data to be processed, determining a node to be stored in the on-board database and a partition to be stored in the node according to the piece of the time sequence data to be processed, and writing the piece of the time sequence data to be processed into a corresponding time sequence in the determined partition to be stored; and a data merging module for writing the each piece of the time sequence data written into the each partition to be stored into each corresponding data bucket in memory respectively and merging the time sequence data in each data bucket in memory.

As a further improvement of the present invention, the data writing module is used for:

for the each piece of the time sequence data, determining a hash value corresponding to a key of the piece of the time sequence data to be processed; and determining the node to be stored corresponding to the piece of the time sequence data to be processed, the partition to be stored in the node to be stored and a corresponding time sequence of the partition to be stored according to the hash value, and writing the piece of the time sequence data to be processed into the corresponding time sequence in the partition to be stored.

As a further improvement of the present invention, the data merging module is used for:

for each time sequence in each partition to be stored, writing the each piece of the time sequence data written into the time sequence within the current time period into a data bucket in memory corresponding to the time sequence; and for the each data bucket in memory, merging each piece of the time sequence data written into the data bucket in memory.

As a further improvement of the present invention, the data writing module is further used for:

compressing the each piece of the time sequence data to be processed respectively according to a time stamp difference and an index value difference between various pieces of the time sequence data to be processed; and writing the compressed each piece of the time sequence data to be processed into a corresponding time sequence in a corresponding partition to be stored respectively.

As a further improvement of the present invention, the data writing module is further used for:

for the each partition to be stored:

writing a first piece of time sequence data to be processed into the partition to be stored;

determining a first time stamp difference and a first index value difference between a second piece of time sequence data to be processed and the first piece of time sequence data to be processed written into the partition to be stored, and storing the first time stamp difference and the first index value difference as a compressed second piece of time sequence data in the partition to be stored;

determining a second time stamp difference and a second index value difference between the third piece of time sequence data to be processed and the second piece of time sequence data to be processed written into the partition to be stored, determining a third time stamp difference between the second time stamp difference and the first time stamp difference and a third index value difference between the second index value difference and the first index value difference, and storing the third time stamp difference and the third index value difference as a compressed third piece of time sequence data in the partition to be stored.

As a further improvement of the present invention, each time stamp difference and each index value difference are represented and stored by different coding methods.

As a further improvement of the present invention, for the each time stamp difference and the each index value difference:

a corresponding coding method is determined according to the time stamp difference and the index value difference;

the time stamp difference or the index value difference is represented and stored by a first coding method in a case where the time stamp difference or the index value difference is greater than or equal to a first value and less than a second value; and the time stamp difference or the index value difference is represented and stored by a second coding method in a case where the time stamp difference or the index value difference is greater than or equal to the second value and less than a third value.

As a further improvement of the present invention, the storage system further comprises:

a first data writing module for determining merged time sequence data to be processed that is written into an on-board hard disk, wherein the merged time sequence data to be processed comprises the merged time sequence data in the each data bucket in memory; and writing the merged time sequence data to be processed into the on-board hard disk.

As a further improvement of the present invention, the first data writing module is further used for:

compressing the merged time sequence data to be processed into data blocks and writing each of the data blocks into the on-board hard disk.

As a further improvement of the present invention, the storage system further comprises:

a log module for determining time sequence data to be recorded comprising remaining time sequence data after the merged time sequence data in the each data bucket in memory is written into the on-board hard disk and the remaining time sequence data of each time sequence in each partition to be stored; recording log information of the time sequence data to be recorded, and determining whether the log information is written into the on-board hard disk and a writing frequency of the log information; and writing the log information into the on-board hard disk at the writing frequency in a case where it is determined that the log information is written into the on-board hard disk.

As a further improvement of the present invention, the storage system further comprises:

a data deleting module for determining time sequence data to be deleted in the on-board hard disk according to a storage time; and deleting the time sequence data to be deleted to write the merged time sequence data to be processed into the on-board hard disk.

As a further improvement of the present invention, the storage system further comprises:

a data summary module for determining summary data of each time sequence in each node to be stored; and storing the summary data of each time sequence according to a summary tree respectively to read the summary data of each time sequence from the memory, wherein the memory comprises various time sequences, various data buckets in memory and various summary trees, wherein each summary tree comprises a root node and multiple layers of nodes from top to bottom, each of which stores the summary data of a time sequence corresponding to the summary tree within a time interval.

As a further improvement of the present invention, the data summary module is further used for:

for the summary tree of each time sequence: for each node in the nth layer of the nodes, determining a mth time interval represented by the node, and storing the summary data of the time sequence data in the time sequence calculated within the mth time interval into the node.

As a further improvement of the present invention, each node in the each summary tree stores an offset from a start time of a parent node to a start time of a current node respectively, and a start time of a time interval represented by the current node is determined by the start time of the parent node and the offset from the start time of the parent node to the start time of the current node.

As a further improvement of the present invention, the storage system further comprises:

a second data writing module for writing the each summary tree into the on-board hard disk to query the summary data of the each time sequence from the on-board hard disk, wherein a hard disk file corresponding to the each summary tree comprises a file header part and a data part, the file header part comprises a key of the time sequence corresponding to the summary tree and the time interval corresponding to the each node of the summary tree, and the data part comprises the summary data stored by each node of the summary tree.

As a further improvement of the present invention, the storage system further comprises:

a data querying module for determining a time interval to be queried and a key of the time sequence corresponding to a summary data to be queried; searching the hard disk file corresponding to the summary data to be queried from the on-board hard disk according to the key of the time sequence corresponding to the summary data to be queried; loading the summary tree corresponding to the summary data to be queried from the hard disk file; and matching from a parent node of the summary tree corresponding to the summary data to be queried, traversing multiple layers of nodes of the summary tree corresponding to the summary data to be queried layer by layer until one or more nodes corresponding to the time interval to be queried are found to obtain the summary data from one or more nodes corresponding to the time interval to be queried.

As a further improvement of the present invention, the data querying module is further used for:

obtaining the summary data of a node in a layer of nodes in the summary tree corresponding to the summary data to be queried, and taking the summary data of the node in the layer of nodes as a query result in a case that the time interval to be queried comprises one node; and obtaining the summary data of a plurality of nodes in a layer of nodes in the summary tree corresponding to the summary data to be queried respectively, and merging the summary data of the plurality of nodes in a case that the time interval to be queried comprises the plurality of nodes, wherein the merged summary data is taken as the query result.

As a further improvement of the present invention, the data querying module is further used for:

discarding the summary data of an upper boundary node and a lower boundary node in a layer of nodes of the summary tree corresponding to the summary data to be queried, and retaining the summary data of nodes other than the upper boundary node and the lower boundary node in the layer of nodes of the summary tree corresponding to the summary data to be queried in a case that the time to be queried does not completely cover the nodes in the layer of nodes of the summary tree corresponding to the summary data to be queried.

In the present invention, an electronic device comprising a memory and a processor is also provided, wherein the memory is configured to store one or more computer instructions that are executed by the processor to implement the method described above.

In the present invention, a non-transitory computer readable storage medium having a computer program stored thereon is provided, wherein the computer program is executed by a processor to implement the method as described.

BRIEF DESCRIPTION OF THE ACCOMPANYING DRAWINGS

In order to more explicitly explain the technical solution in the embodiments of the present invention or the prior art, a brief introduction will be given below for the accompanying drawings required for use in the description of the embodiments or the prior art. It is obvious that, the accompanying drawings described below are merely some of the embodiments of the present invention. For those skilled in the art, other accompanying drawings may also be obtained according to such accompanying drawings on the premise that no inventive effort is involved.

DETAILED DESCRIPTION

Figure 1:
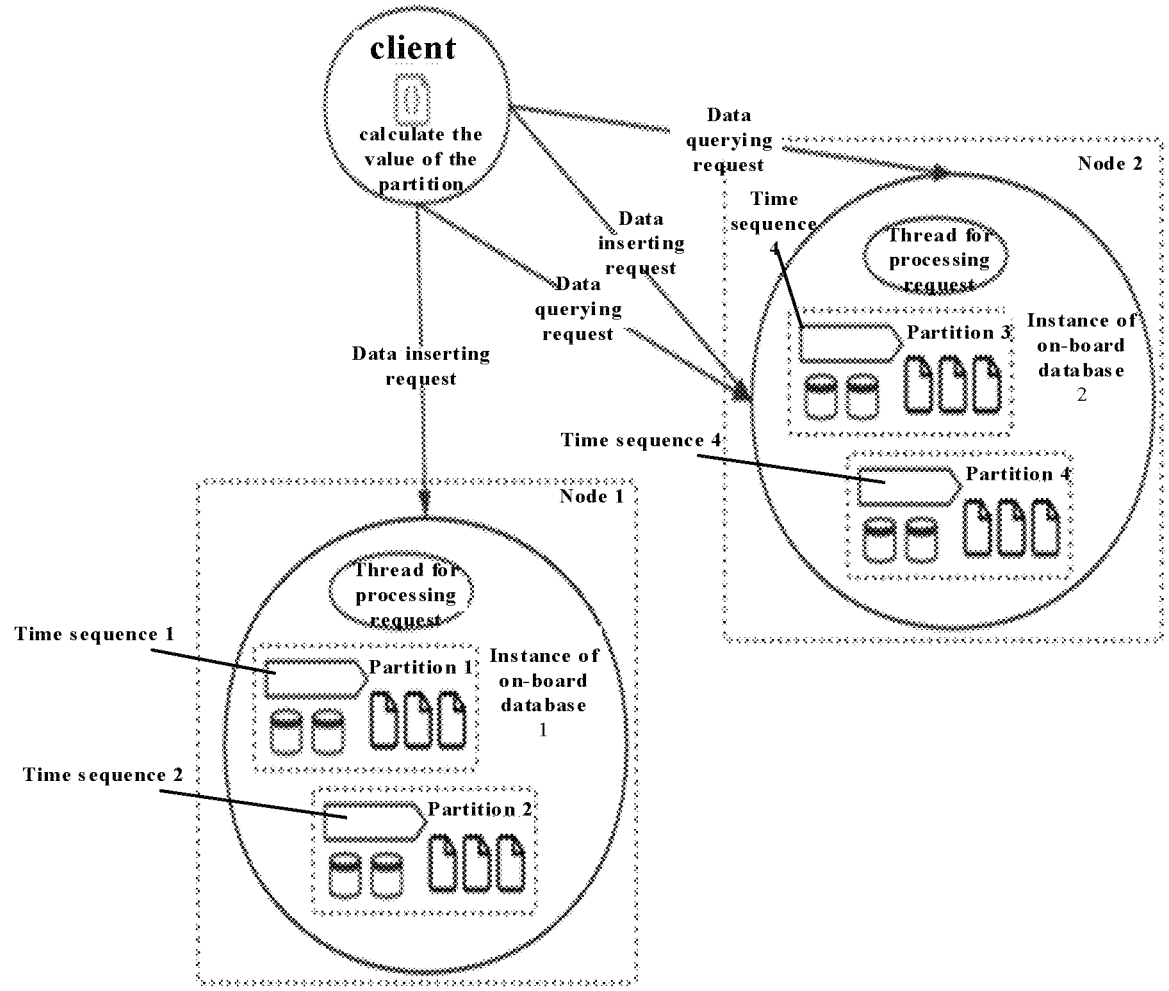
FIG. 1 is a schematic view of the on-board database according to one exemplary embodiment of the present invention.

The technical solution in the embodiments of the present invention will be explicitly and completely described below in conjunction with the accompanying drawings in the embodiments of the present invention. Apparently, the embodiments described are merely some of the embodiments of the present disclosure, rather than all the embodiments. On the basis of the embodiments of the present invention, all the other embodiments obtained by those skilled in the art fall into the protection scope of the present invention on the premise that no inventive effort is involved.

It should be noted that, if there are directional indications (for example, up, down, left, right, front, back, . . . ) involved in the embodiment of the present invention, the directional indications are only used to explain the relative positional relationships, the movement conditions and the like between various components in a specific posture (as shown in the accompanying drawings), and if the specific posture changes, the directional indications will also change accordingly.

In addition, in the description of the present invention, the terms used are for illustrative purposes only, rather than being intended to limit the scope of the present invention. The terms "comprising" and/or "containing" are used to specify the presence of said elements, steps, operations and/or components, but do not exclude the presence or addition of one or more other elements, steps, operations and/or components. The terms such as "first" and "second" which might be used to describe various elements, do not represent a sequence, or limit these elements. In addition, in the description of the present invention, the meaning of "a plurality of" is two or more unless stated otherwise. These terms are only used to distinguish one element from another element.

In conjunction with the following accompanying drawings, these and/or other aspects will become apparent, and those of ordinary skill in the art will more easily understand the description of the embodiments of the present invention. The accompanying drawings are used to depict the embodiments of the present invention only for illustrative purposes. Those skilled in the art will easily realize from the following description that, alternative embodiments of the structure and method shown in the present invention may be adopted without departing from said principles of the present invention.

According to the embodiment of the present invention, an on-board data storage method is provided, wherein the method is used for an on-board database, the method comprising the steps of:

obtaining, in a current time period, various pieces of time sequence data to be processed written into the on-board database;

for each piece of the time sequence data to be processed, determining a node to be stored in the on-board database and a partition to be stored in the node according to the piece of the time sequence data to be processed, and writing the piece of the time sequence data to be processed into a corresponding time sequence in the determined partition to be stored; and writing the each piece of the time sequence data written into the each partition to be stored into each corresponding data bucket in memory respectively and merging the time sequence data in each data bucket in memory.

Figure 2:
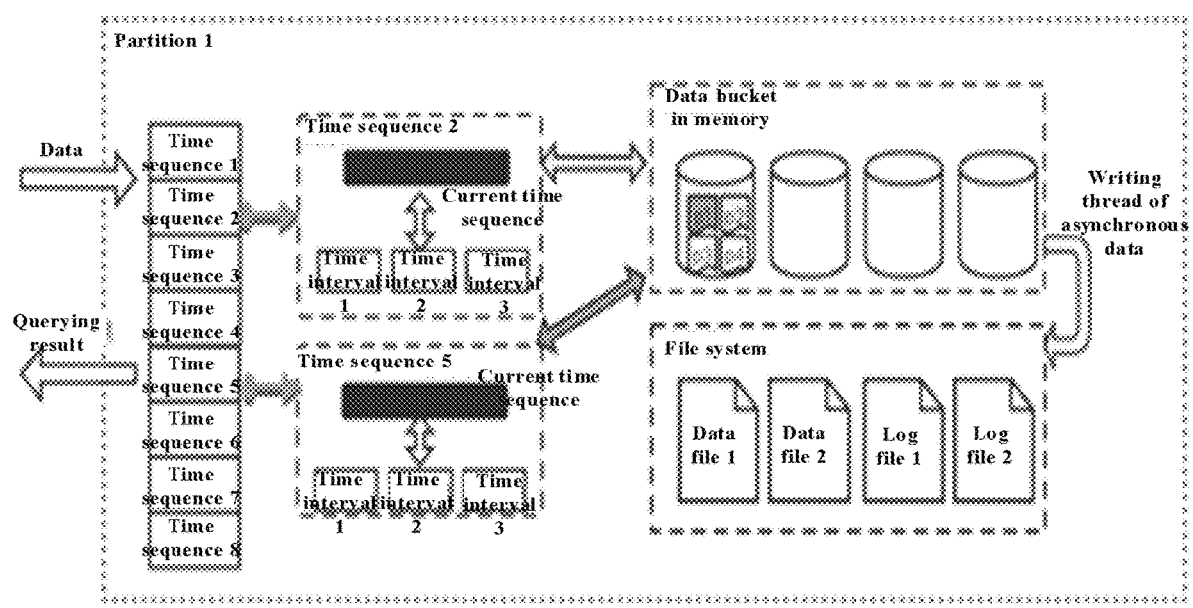
FIG. 2 is a schematic view of the storage system of on-board database according to one exemplary embodiment of the present invention.

As shown in FIG. 1, the on-board database of the present invention comprises a plurality of nodes, which may be physical nodes or virtual nodes, with one or more on-board database instances operating at each node, and an on-board database storage system operating for each on-board database instance (i.e., a node to be stored). As shown in FIG. 2, the storage system of on-board database is divided into a plurality of partitions, each of which comprises a plurality of time sequence (a time sequence represents time sequence data of a plurality of time periods with the same keyword), a plurality of data bucket in memory and hard disk files (data files and log files). When the client sends a data insertion request (for time sequence data to be processed) or a query request, a corresponding request is sent to a partition in a corresponding vehicle database instance.

In one alternative embodiment, for each piece of the time sequence data to be processed, determining a node to be stored in the on-board database and a partition to be stored in the node according to the piece of the time sequence data to be processed, and writing the piece of the time sequence data to be processed into a corresponding time sequence in the determined partition to be stored comprises:

for the each piece of the time sequence data, determining a hash value corresponding to a key of the piece of the time sequence data to be processed;

determining the node to be stored corresponding to the piece of the time sequence data to be processed, the partition to be stored in the node to be stored and a corresponding time sequence of the partition to be stored according to the hash value, and writing the piece of the time sequence data to be processed into the corresponding time sequence in the partition to be stored; and writing each piece of the time sequence data to be processed into each time sequence in each partition to be stored respectively, and so forth.

For example, when a piece of time sequence data to be processed <timestamp, key, value> is inserted, it is necessary to calculate the hash value according to a key of the piece of time sequence data to be processed firstly, and then decide a storage node to which the insertion request is sent according to the hash value. In the present invention, the time sequence data is segmented and cached in each time sequence of each partition to be stored according to the time and the key value, wherein each different key corresponds to a different time sequence, and each time sequence has the same key. In this way, the reading and writing operations of time sequence data may all be carried out in the memory (the memory comprises a plurality of time sequence, a plurality of data buckets in memory and a plurality of summary trees), so that the on-board database may bear writing operations of millisecond data level.

In an alternative embodiment, the writing the each piece of the time sequence data written into the each partition to be stored into each corresponding data bucket in memory respectively and merging the time sequence data in each data bucket in memory comprises:

for each time sequence in each partition to be stored, writing the each piece of the time sequence data written into the time sequence within the current time period into a data bucket in memory corresponding to the time sequence;

for the each data bucket in memory, merging each piece of the time sequence data written into the data bucket in memory; and writing the each time sequence data written into the each partition to be stored into the each corresponding data bucket in memory respectively, and merging the each piece of time sequence data in the each data bucket in memory, and so forth.

In the present invention, the memory comprises a plurality of time sequence and a plurality of data buckets in memory, with several time sequence corresponding to a data bucket in memory, wherein each piece of time sequence data in a current time period of each time sequence will be written into a data bucket in memory after the time sequence data of the current time period is completely written, so that each piece of time sequence data of the current time period will be merged in the data bucket in memory. For example, it is set that each time sequence comprises 10 minutes of time sequence data. After a piece of time sequence data is written into a corresponding time sequence for 10 minutes, each time sequence data of each time sequence (for example, two time sequence) in the current time period will be written into a data bucket in memory respectively, and then the time sequence data in a next time period starts to be written, so that each piece of time sequence data corresponding to each time sequence (for example, two time sequence) in the current time period that has been written into the data bucket in memory will be merged and hold on to be written into the hard disk.

In one alternative embodiment, the writing the each piece of the time sequence data written into the each partition to be stored into each corresponding data bucket in memory respectively and merging the time sequence data in each data bucket in memory comprises:

compressing the each piece of the time sequence data to be processed respectively according to a time stamp difference and an index value difference between various pieces of the time sequence data to be processed; and writing the compressed each piece of the time sequence data to be processed into a corresponding time sequence in a corresponding partition to be stored respectively.

Since the on-board data has a large amount of data, in the present invention, the time sequence data written into the memory is compressed, and the amount of data written into the on-board hard disk in a later period is controlled. For example, each piece of time sequence data <timestamp, key, value> is compressed and stored. Generally, an index value for the on-board time sequence data is collected at a fixed frequency, with a slight fluctuation interval of the index value, and a very small difference between the values of timestamp and value in the triples corresponding to the adjacent sequence data. Therefore, in the present invention, the time sequence data is compressed by recording the difference instead of the original value, and more time sequence data can be stored in the memory after compression.

In one alternative embodiment, the compressing the each piece of the time sequence data to be processed respectively according to a time stamp difference and an index value difference between various pieces of the time sequence data to be processed comprises:

for the each partition to be stored:

writing a first piece of time sequence data to be processed into the partition to be stored;

determining a first time stamp difference and a first index value difference between a second piece of time sequence data to be processed and the first piece of time sequence data to be processed written into the partition to be stored, and storing the first time stamp difference and the first index value difference as a compressed second piece of time sequence data in the partition to be stored;

determining a second time stamp difference and a second index value difference between the third piece of time sequence data to be processed and the second piece of time sequence data to be processed written into the partition to be stored, determining a third time stamp difference between the second time stamp difference and the first time stamp difference and a third index value difference between the second index value difference and the first index value difference, and storing the third time stamp difference and the third index value difference as a compressed third piece of time sequence data in the partition to be stored; and compressing and storing the each piece of the time sequence data to be processed through each time stamp difference and each index value difference and so forth.

In the present invention, for example, $<\Delta(\Delta timestamp), \Delta(\Delta value)>$ is stored to realize the compression of time sequence data, wherein $\Delta timestamp$ represents the difference between a time stamp in a current time sequence data and a time stamp of a previous time sequence data, $\Delta(\Delta timestamp)$ represents the difference between two adjacent differences of time stamps, $\Delta value$ represents the difference between the index values in the current time sequence data and the previous time sequence data, and $\Delta(\Delta value)$ represents the difference ($\Delta value1 - \Delta value2$) between the two adjacent index values, where $\Delta value1$ represents the index value difference between the current time sequence data and the previous time sequence data, and $\Delta value2$ represents the index value difference between the previous time sequence data and the one before the previous time sequence data. For example, in a time sequence, there are four items time sequence data, which are respectively <1585137131985, "VhlSpd", 43.5>, <1585137132035, "VhlSpd", 43.6>, <1585137132085, "VhlSpd", 43.7>, <1585137132135, "VhlSpd", 43.9>. Since the first time sequence data serves as the first data within the time sequence, it is necessary to store a key (VhlSpd), that is, the first time sequence data will be stored as <1585137131985, 43.5>. For other time sequence data in this time sequence, there is no need to store a key. For the second time sequence data, only the difference from the first time sequence data is stored, that is, the second time sequence data is stored as <50, 0.1>. For the third time sequence data, the difference from the second time sequence data is first calculated to be <50, 0.1>, and the difference between this difference and the difference between the second time sequence data and the first time sequence data <50, 0.1> is then calculated, that is, the third time sequence data is stored as <0, 0>. The difference between the fourth time sequence data and the third time sequence data is <50, 0.2>, and the difference between this difference and the difference <50, 0.1> between the third time sequence data and the second time sequence data is <0, 0.1>, that is, the fourth time sequence data is stored as <0, 0.1>, and so forth.

In one alternative embodiment, each time stamp difference and each index value difference are represented and stored by different coding methods.

In one alternative embodiment,
for the each time stamp difference and the each index value difference:
a corresponding coding method is determined according to the time stamp difference and the index value difference;
the time stamp difference or the index value difference is represented and stored by a first coding method in a case where the time stamp difference or the index value difference is greater than or equal to a first value and less than a second value;
the time stamp difference or the index value difference is represented and stored by a second coding method in a case where the time stamp difference or the index value difference is greater than or equal to the second value and less than a third value; and
representing and storing the each time stamp difference and the each index value difference by different coding methods, and so forth.

As mentioned above, there will not be a significant difference between the time stamp difference and the index value difference between the two adjacent time sequence data, and the value range of the difference is much smaller than that of the original value. The difference may be encoded and represented according to the difference range and then stored. For example, the difference 0 may be represented by one bit binary 0, and the difference may be represented by eight bit codes between −128 and 127. In the present invention, various coding methods are not specifically defined. By storing the difference with an encoding method, the length of the stored data may be much smaller than the original data, so that more time sequence data can be stored in the memory. In addition, a first piece of time sequence data in each time sequence will store a key, while the time sequence data behind the same time sequence will not store a key value, so that it is possible to greatly save the memory space.

In one alternative embodiment, the method further comprises:
determining merged time sequence data to be processed that is written into an on-board hard disk, wherein the merged time sequence data to be processed comprises the merged time sequence data in the each data bucket in memory; and
writing the merged time sequence data to be processed into the on-board hard disk.

In one alternative embodiment, the writing the merged time sequence data to be processed into the on-board hard disk comprises: compressing the merged time sequence data to be processed into data blocks and writing each of the data blocks into the on-board hard disk.

As shown in FIG. 2, in the present invention, the merged time sequence data is written into the hard disk from the data bucket in memory in an asynchronous regular writing method. This writing method may write the data of all the time periods waiting to be written in the data bucket in memory in one writing operation, so as to simultaneously write data of a plurality of time periods on the hard disk as much as possible. In addition, in the present invention, the data required to be written to the hard disk is compressed in units of data blocks, so as to further reduce the amount of data to be written to the hard disk.

In one alternative embodiment, the method further comprises:
determining time sequence data to be recorded comprising remaining time sequence data after the merged time sequence data in the each data bucket in memory is written into the on-board hard disk and the remaining time sequence data of each time sequence in each partition to be stored;
recording log information of the time sequence data to be recorded, and determining whether the log information is written into the on-board hard disk and a writing frequency of the log information; and
writing the log information into the on-board hard disk at the writing frequency in a case where it is determined that the log information is written into the on-board hard disk.

Since an asynchronous writing method, instead of a real-time writing method is used, some time sequence data will remain in each data bucket in memory and each time sequence, and this part of data will be easily lost when the system is powered off or system downtime occurs due to other reasons. In order to avoid the loss of this part of data, in the present invention, a log may be recorded for this part of data, so that when the system encounters downtime or power-off, this part of data may be recovered from the log after the system is restarted. In the on-board control device, there are some signals generated by the control device, which do not require high data security. The loss of this part of data with low requirements will not have a great impact on the on-board system. In this case, in order to reduce the writing times of the on-board hard disk, it may be determined by configuration whether a log needs to be written to the on-board hard disk and with what writing frequency the log is written to the on-board hard disk.

The index data of the on-board control device, which is a feedback of a device performance or an operation behavior at a certain moment, is read-only data. If it is allowed to be modified, unsafe tampering behavior will be inevitable. According to the present invention, it may be provided that the data written to each storage node cannot be modified, so that it is possible to avoid modifying data files and log files written on the on-board hard disk, thereby further reducing the times of writing into the on-board hard disk.

In one alternative embodiment, the method further comprises:
determining time sequence data to be deleted in the on-board hard disk according to a storage time; and
deleting the time sequence data to be deleted to write the merged time sequence data to be processed into the on-board hard disk.

With the elapse of time, the amount of data written to the on-board hard disk will become larger and larger, and if it is not deleted regularly, it is possible to exceed the capacity of the hard disk. The foremost purpose of the index data of the on-board control device is to perform analysis and monitoring. Both analysis and monitoring are realized by performing analysis and processing based on the latest data, and then the processed data or the analysis result is synchronized to the server. Therefore, the data access in the on-board database is access to the latest data, and the value of the data will be lowered gradually with the elapse of its storage duration. After the data has been stored for a period of time, its value has substantially approached zero. In the present invention, the data which is stored exceeding the storage time may be automatically deleted, and the storage time may be set. The present invention does not specifically define the storage time.

In one alternative embodiment, the method further comprises:
determining summary data of each time sequence in each node to be stored; and storing the summary data of each time sequence according to a summary tree respectively to read the summary data of each time sequence from the memory, wherein the memory comprises various time sequences, various data buckets in memory and various summary trees, wherein each summary tree comprises a root node and multiple layers of nodes from top to bottom, each of which stores the summary data of a time sequence corresponding to the summary tree within a time interval.

In one alternative embodiment, wherein the storing the summary data of each time sequence according to a summary tree respectively comprises:

for the summary tree of each time sequence:

for each node in the nth layer of the nodes, determining a mth time interval represented by the node, and storing the summary data of the time sequence data in the time sequence calculated within the mth time interval into the node;

for each node in the (n−1)th layer of the nodes, determining a (m−1)th time interval represented by the node, and storing the summary data of the time sequence data in the time sequence calculated within the (m−1)th time interval into the node;

storing the summary data of each time sequence data in the time sequence in each time interval to each node in the summary tree respectively, and so forth; and storing the summary data of each time sequence according to a summary tree respectively, and so forth.

Figure 3:
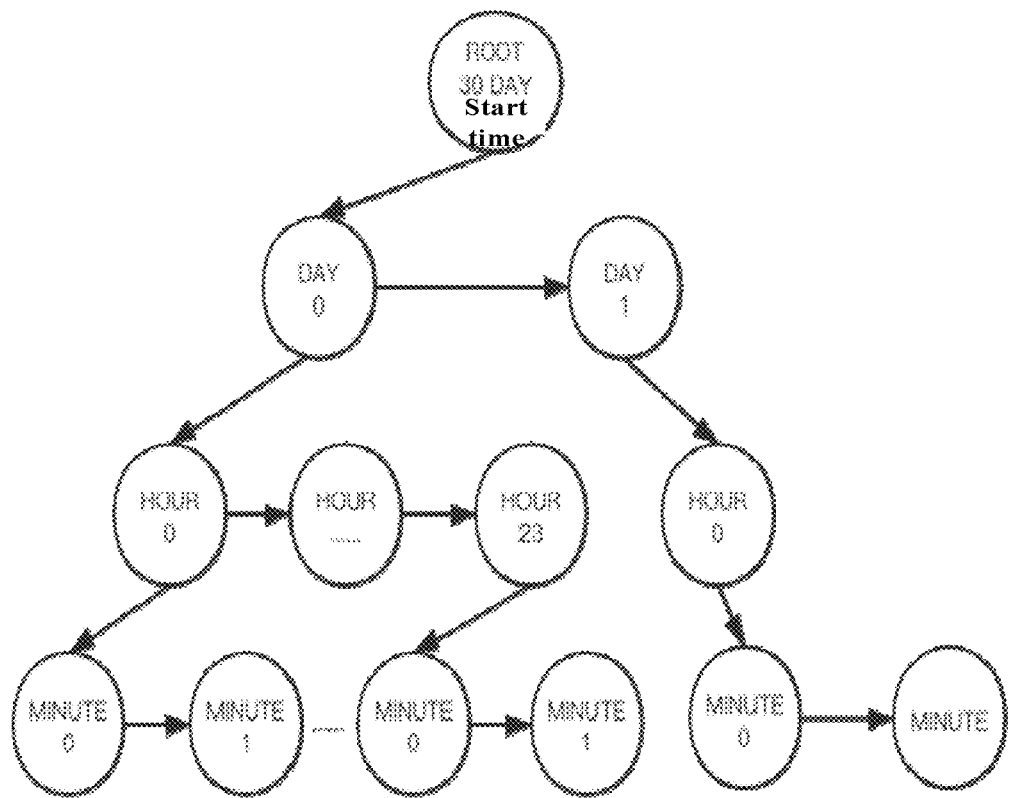
FIG. 3 is a schematic view of the summary tree structure according to one exemplary embodiment of the present invention.

In this invention, the summary data is stored by the summary tree for each time sequence required to be performed summary calculation. It is possible to quickly read the required summary calculation result from the on-board database, instead of sending the original data back to the cloud for calculation, or perform the on-board database calculation from the original data and then return the result during the query process. For example, as shown in FIG. 3, each node in the summary tree represents a time interval having summary data of a certain time sequence within this time interval stored thereon. For example, the root node represents the summary data within 30 days from the start time stored in the root node, for example sum value, count value, min value and max value; the first node in the second level represents the summary data within the first day from the start time of the root node; the first node in the third level represents the summary data within the first hour from the start time of the root node; and the first node in the fourth level represents the summary data within the first minute from the start time of the root node.

According to the present invention, a summary tree is reserved in the memory for each time sequence required to be summary calculation. When data is written into a certain time sequence, the on-board database synchronously updates the summary tree. When the written time sequence data exceeds the time range represented by the current summary tree, the on-board database writes this summary tree to the on-board hard disk, and then the summary tree is reconstructed in the memory to store the summary data of the next time period.

The summary tree described in the present invention is different from the Merge Tree method. Merge Tree can only be applied to relational data, but not to time sequence data. Each node in the summary tree stores a time interval, which represents the start and end time of summary calculation. As shown in FIG. 3, for example, the summary tree nodes may be divided into four different types: ROOT, DAY, HOUR and MINUTE, wherein the ROOT type means that the node has stored summary data for 30 DAYs, the DAY type means that the node has stored summary data for 1 day, the HOUR type means that the node has stored summary data for 1 hour, and the MINUTE type means that the node has stored summary data for 1 minute. Since the time interval of each node is a fixed interval and the size of the interval is related to the type of the node, each node is not required to store the end time of the time interval represented by the same, but only to store the start time of the time interval represented by the same, so that the end time of the time interval represented by the node can be calculated according to the type of the node. The present invention does not specifically define the type of the summary tree node.

In one alternative embodiment, each node in the each summary tree stores an offset from a start time of a parent node to a start time of a current node respectively, and a start time of a time interval represented by the current node is determined by the start time of the parent node and the offset from the start time of the parent node to the start time of the current node.

When data is queried from the summary tree, it is generally to transverse from the root node to the parent node of the current node and then to the current node. In the present invention, only the offset from the start time of the parent node to the start time of the current node is stored in the summary tree node, which may further save the storage space.

In one alternative embodiment, the method further comprises:

writing the each summary tree into the on-board hard disk to query the summary data of the each time sequence from the on-board hard disk, wherein a hard disk file corresponding to the each summary tree comprises a file header part and a data part, the file header part comprises a key of the time sequence corresponding to the summary tree and the time interval corresponding to the each node of the summary tree, and the data part comprises the summary data stored by each node of the summary tree.

In one alternative embodiment, the method further comprises:

determining a time interval to be queried and a key of the time sequence corresponding to a summary data to be queried;

searching the hard disk file corresponding to the summary data to be queried from the on-board hard disk according to the key of the time sequence corresponding to the summary data to be queried;

loading the summary tree corresponding to the summary data to be queried from the hard disk file; and matching from a parent node of the summary tree corresponding to the summary data to be queried, traversing multiple layers of nodes of the summary tree corresponding to the summary data to be queried layer by layer until one or more nodes corresponding to the time interval to be queried are found to obtain the summary data from one or more nodes corresponding to the time interval to be queried.

According to the present invention, when data is inserted, the summary data is pre-calculated, and the summary data and the original data are written on the hard disk together, thereby reducing the writing times of the hard disk of the on-board device. Moreover, a file screening mechanism is provided by setting the file header part on the hard disk, which may greatly improve the query efficiency of the summary data.

In one alternative embodiment, when one or more nodes corresponding to the time interval to be queried are searched, the summary data of a node in a layer of nodes in the summary tree corresponding to the summary data to be queried is obtained, and the summary data of the node in the layer of nodes is taken as a query result in a case that the time interval to be queried comprises one node; and the summary data of a plurality of nodes in a layer of nodes in the summary tree corresponding to the summary data to be queried is obtained respectively, and the summary data of the plurality of nodes is merged in a case that the time interval to be queried comprises the plurality of nodes, wherein the merged summary data is taken as the query result.

It may be understood from the above that, when one or more nodes of the summary tree corresponding to the time interval to be queried are searched, upon traversing to a certain level of nodes in the summary tree, if the time interval to be queried comprises a certain node in this level of nodes, the summary data of this node may be taken as the query result, and if the time interval to be queried comprises some nodes in this level of nodes, the data after merging the summary data of these nodes may be taken as the query result.

Figure 4:
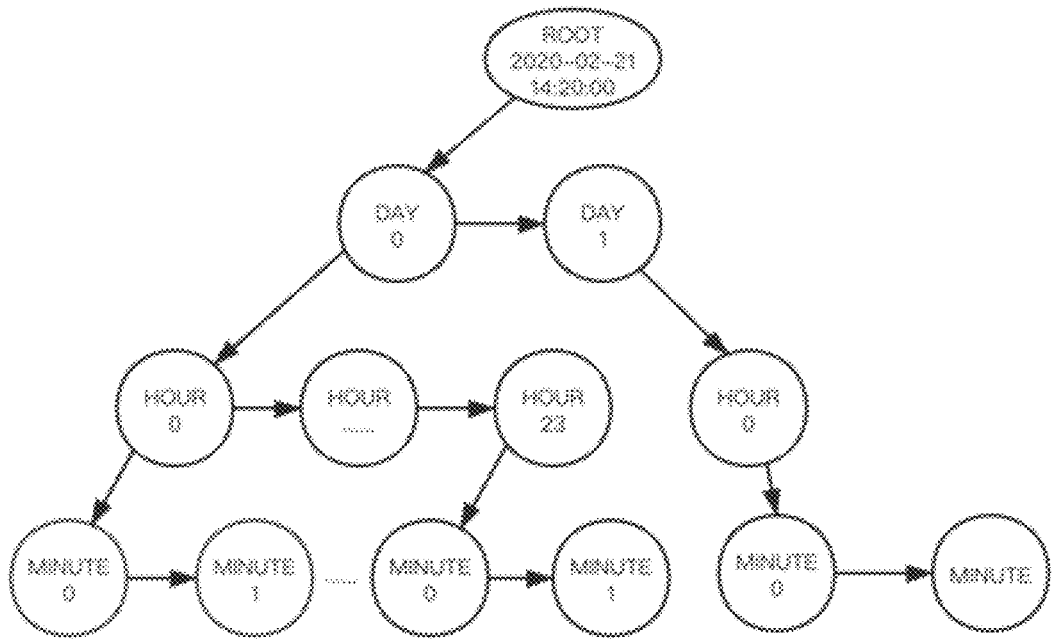
FIG. 4 is a schematic view of querying summary data according to one exemplary embodiment of the present invention.

For example, as shown in FIG. 4, when it is necessary to query the maximum value among all the data of a certain key in a certain time period <2020-02-21 14:20:00, 2020-02-21 14:21:01>, the query is expressed as <key, 2020-02-21 14:20:00, 2020-02-21 14:21:01, max>. First, the summary tree corresponding to the key is found from the memory, and then matching starts from the root node, and the corresponding time interval is queried, so that it is found that the query interval is covered by the time interval of the first node in the second level of nodes of the summary tree. Thus, the query is shifted to start from the first node in the second level of nodes of the summary tree, and then it is found that the query interval is covered by the time interval of the first node in the third level of nodes in the summary tree. Thereinafter, the query is shifted to start from the first node in the third level of nodes of the summary tree, and then it is found that the query interval is the merging of the time intervals represented by the first node and the second node in the fourth level of nodes. Thus, the query is shifted to query the first node and the second node in the fourth level of nodes of the summary tree respectively, and then the query results are merged to obtain the maximum value.

In one alternative embodiment, when one or more nodes corresponding to the time interval to be queried are searched, the summary data of an upper boundary node and a lower boundary node in a layer of nodes of the summary tree corresponding to the summary data to be queried is discarded, and the summary data of nodes other than the upper boundary node and the lower boundary node in the layer of nodes of the summary tree corresponding to the summary data to be queried is retained in a case that the time to be queried does not completely cover the nodes in the layer of nodes of the summary tree corresponding to the summary data to be queried.

It may be understood from the above that, when one or more nodes of the summary tree corresponding to the interval to be queried are searched, upon traversing to a certain level of nodes in the summary tree, if a certain node in this level of nodes is not completely covered by the query time interval, it is necessary to discard the summary data of the upper boundary node and the lower boundary node in this level of nodes and retain the summary data of other nodes in this level of nodes.

Figure 5:
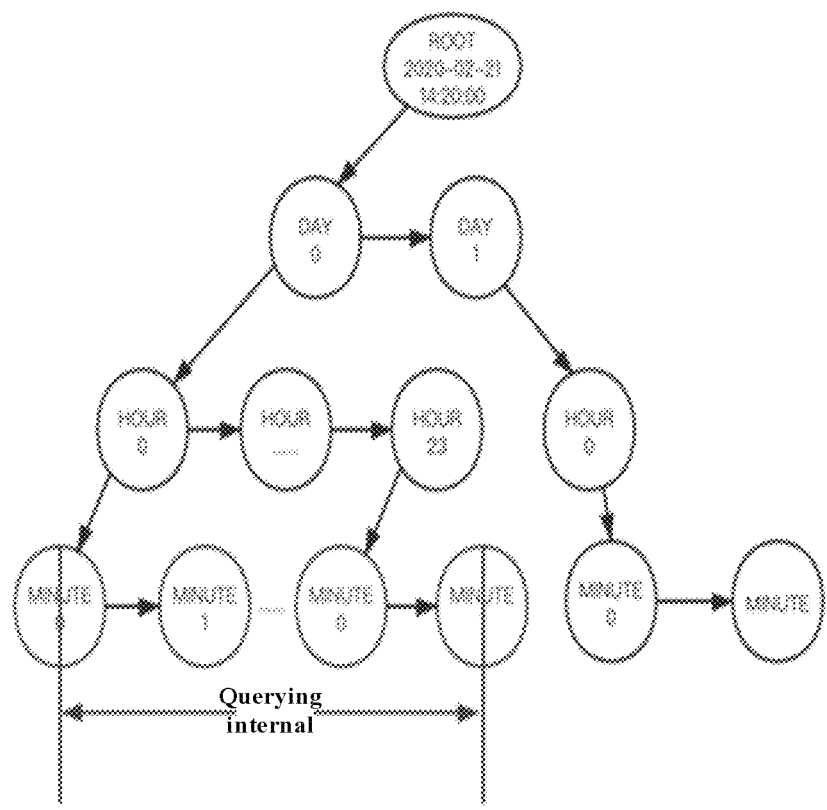
FIG. 5 is a schematic view of querying summary data according to a further exemplary embodiment of the present invention.

For example, as shown in FIG. 5, when the query interval does not completely cover one node in a certain level of nodes in one summary tree, in order to ensure the correctness of data, it is necessary to discard the nodes at the upper and lower boundaries in this level of nodes of the summary tree (for example, the leftmost and rightmost nodes in the fourth level in FIG. 5), and the summary data of other nodes will be added to the calculation of the final result (for example, the summary data of the nodes between the second node and the last but two nodes from the right in the fourth layer is added to the calculation of the final result).

The types and numbers of nodes in each layer of the summary tree according to the present invention are different, and the represented time intervals are also different. By this summary tree, it is possible to store, for example, the summary data of a time sequence for 30 days, comprising: min value, max value, sum value and count value. The minimum supported granularity of the time interval is minute, and only 4M storage space is required. By using the summary tree, the time complexity of the summary data query based on the time interval may be reduced from $O(\log_{60} N)$ to $O(\log_{24} N)$. When the summary tree is written to the hard disk file, the key of the time sequence corresponding to the summary tree and the time interval represented by each node in the summary tree are reserved in the file header part of the hard disk file. In this way, upon querying, it is possible to directly obtain these information from the file header part without parsing the file content, and judge whether the summary tree saved in the file is the object to be queried. If not, it is possible to skip parsing the file content (data part) and speed up the query.

According to the embodiment of the present invention, a storage system of on-board data is provided, wherein the system is used for an on-board database, the system comprises:

a data writing module for: for each piece of the time sequence data to be processed, determining a node to be stored in the on-board database and a partition to be stored in the node according to the piece of the time sequence data to be processed, and writing the piece of the time sequence data to be processed into a corresponding time sequence in the determined partition to be stored; and a data merging module for writing the each piece of the time sequence data written into the each partition to be stored into each corresponding data bucket in memory respectively and merging the time sequence data in each data bucket in memory.

In an alternative embodiment, the data writing module is used for:

for the each piece of the time sequence data,
determining a hash value corresponding to a key of the piece of the time sequence data to be processed; and
determining the node to be stored corresponding to the piece of the time sequence data to be processed, the partition to be stored in the node to be stored and a corresponding time sequence of the partition to be stored according to the hash value, and writing the piece of the time sequence data to be processed into the corresponding time sequence in the partition to be stored.

In an alternative embodiment, the data merging module is used for:

for each time sequence in each partition to be stored, writing the each piece of the time sequence data written into the time sequence within the current time period into a data bucket in memory corresponding to the time sequence; and for the each data bucket in memory, merging each piece of the time sequence data written into the data bucket in memory.

In an alternative embodiment, the data writing module is further used for:

compressing the each piece of the time sequence data to be processed respectively according to a time stamp difference and an index value difference between various pieces of the time sequence data to be processed; and writing the compressed each piece of the time sequence data to be processed into a corresponding time sequence in a corresponding partition to be stored respectively.

In an alternative embodiment, the data writing module is further used for:

for the each partition to be stored:

writing a first piece of time sequence data to be processed into the partition to be stored;

determining a first time stamp difference and a first index value difference between a second piece of time sequence data to be processed and the first piece of time sequence data to be processed written into the partition to be stored, and storing the first time stamp difference and the first index value difference as a compressed second piece of time sequence data in the partition to be stored;

determining a second time stamp difference and a second index value difference between the third piece of time sequence data to be processed and the second piece of time sequence data to be processed written into the partition to be stored, determining a third time stamp difference between the second time stamp difference and the first time stamp difference and a third index value difference between the second index value difference and the first index value difference, and storing the third time stamp difference and the third index value difference as a compressed third piece of time sequence data in the partition to be stored.

In an alternative embodiment, each time stamp difference and each index value difference are represented and stored by different coding methods.

In an alternative embodiment, for the each time stamp difference and the each index value difference:

a corresponding coding method is determined according to the time stamp difference and the index value difference;

the time stamp difference or the index value difference is represented and stored by a first coding method in a case where the time stamp difference or the index value difference is greater than or equal to a first value and less than a second value; and the time stamp difference or the index value difference is represented and stored by a second coding method in a case where the time stamp difference or the index value difference is greater than or equal to the second value and less than a third value.

In an alternative embodiment, the storage system further comprises:

a first data writing module for determining merged time sequence data to be processed that is written into an on-board hard disk, wherein the merged time sequence data to be processed comprises the merged time sequence data in the each data bucket in memory; and writing the merged time sequence data to be processed into the on-board hard disk.

In an alternative embodiment, the first data writing module is further used for:

compressing the merged time sequence data to be processed into data blocks and writing each of the data blocks into the on-board hard disk.

In an alternative embodiment, the storage system further comprises:

a log module for determining time sequence data to be recorded comprising remaining time sequence data after the merged time sequence data in the each data bucket in memory is written into the on-board hard disk and the remaining time sequence data of each time sequence in each partition to be stored; recording log information of the time sequence data to be recorded, and determining whether the log information is written into the on-board hard disk and a writing frequency of the log information; and writing the log information into the on-board hard disk at the writing frequency in a case where it is determined that the log information is written into the on-board hard disk.

In an alternative embodiment, the storage system further comprises:

a data deleting module for determining time sequence data to be deleted in the on-board hard disk according to a storage time; and deleting the time sequence data to be deleted to write the merged time sequence data to be processed into the on-board hard disk.

In an alternative embodiment, the storage system further comprises:

a data summary module for determining summary data of each time sequence in each node to be stored; and storing the summary data of each time sequence according to a summary tree respectively to read the summary data of each time sequence from the memory, wherein the memory comprises various time sequences, various data buckets in memory and various summary trees, wherein each summary tree comprises a root node and multiple layers of nodes from top to bottom, each of which stores the summary data of a time sequence corresponding to the summary tree within a time interval.

In an alternative embodiment, the data summary module is further used for:

for the summary tree of each time sequence: for each node in the nth layer of the nodes, determining a mth time interval represented by the node, and storing the summary data of the time sequence data in the time sequence calculated within the mth time interval into the node.

In an alternative embodiment, each node in the each summary tree stores an offset from a start time of a parent node to a start time of a current node respectively, and a start time of a time interval represented by the current node is determined by the start time of the parent node and the offset from the start time of the parent node to the start time of the current node.

In an alternative embodiment, the storage system further comprises:

a second data writing module for writing the each summary tree into the on-board hard disk to query the summary data of the each time sequence from the on-board hard disk, wherein a hard disk file corresponding to the each summary tree comprises a file header part and a data part, the file header part comprises a key of the time sequence corresponding to the summary tree and the time interval corresponding to the each node of the summary tree, and the data part comprises the summary data stored by each node of the summary tree.

In an alternative embodiment, the storage system further comprises:

a data querying module for determining a time interval to be queried and a key of the time sequence corresponding to a summary data to be queried; searching the hard disk file corresponding to the summary data to be queried from the on-board hard disk according to the key of the time sequence corresponding to the summary data to be queried; loading the summary tree corresponding to the summary data to be queried from the hard disk file; and matching from a parent node of the summary tree corresponding to the summary data to be queried, traversing multiple layers of nodes of the summary tree corresponding to the summary data to be queried layer by layer until one or more nodes corresponding to the time interval to be queried are found to obtain the summary data from one or more nodes corresponding to the time interval to be queried.

In an alternative embodiment, the data querying module is further used for:

obtaining the summary data of a node in a layer of nodes in the summary tree corresponding to the summary data to be queried, and taking the summary data of the node in the layer of nodes as a query result in a case that the time interval to be queried comprises one node; and obtaining the summary data of a plurality of nodes in a layer of nodes in the summary tree corresponding to the summary data to be queried respectively, and merging the summary data of the plurality of nodes in a case that the time interval to be queried comprises the plurality of nodes, wherein the merged summary data is taken as the query result.

In an alternative embodiment, the data querying module is further used for:

discarding the summary data of an upper boundary node and a lower boundary node in a layer of nodes of the summary tree corresponding to the summary data to be queried, and retaining the summary data of nodes other than the upper boundary node and the lower boundary node in the layer of nodes of the summary tree corresponding to the summary data to be queried in a case that the time to be queried does not completely cover the nodes in the layer of nodes of the summary tree corresponding to the summary data to be queried.

The present disclosure also relates to an electronic device, including a server, a terminal and the like. The electronic device comprises: at least one processor; a memory communicatively connected with the at least one processor; and a communication component communicatively connected with the storage medium, wherein the communication component receives and sends data under the control of the processor; wherein the memory stores instructions that may be executed by at least one processor to implement the storage method of on-board data in the above-described embodiments.

In one alternative embodiment, as a non-volatile computer readable storage medium, the memory may be configured to store a non-volatile software program, a non-volatile computer executable program and a module. By running a nonvolatile software program, an instruction and a module stored in the memory, the processor performs various functional applications and data processing of the device, that is, realizing the on-board data storage method.

The memory may include a storage program area and a storage data area, wherein the storage program area may store an operating system and application programs required by at least one function; the storage data area may store an options list or the like. In addition, the memory may include a high-speed random access memory and a non-volatile memory, for example at least one disk memory device, flash memory device, or other non-volatile solid-state memory devices. In some embodiments, the memory may optionally include memories remotely provided relative to the processor, such that these remote memories may be connected to external devices through a network. Examples of the above-described networks include, but are not limited to, Internet, intranet, local area network, mobile communication network and combinations thereof.

One or more modules are stored in the memory, and when they are executed by one or more processors, the storage method of on-board data according to any of the above-described embodiments is performed.

The above-described products may perform the storage method of on-board data provided by the embodiments of the present application, and have corresponding functional modules and beneficial effects for performing the method. For technical details not described in detail in this embodiment, please refer to the on-board data storage method provided by the embodiments of the present application.

The present disclosure also relates to a non-transitory computer-readable storage medium for storing a computer-readable program that is executed by a computer to perform some or all the embodiments of on-board data storage method described above.

That is, those skilled in the art may understand that, the implementation of all or some of the steps in the method according to the above-described embodiments may be completed by instructing related hardware through a program stored in a storage medium and comprising several instructions to make a device (for example, a single chip, a chip, or the like) or a processor perform all or some of the steps of the method according to various embodiments of the present application. The aforementioned storage media comprises: various media that may store program codes such as a U disk, a mobile hard disk, a Read-Only Memory (ROM), a Random Access Memory (RAM), a magnetic disk or an optical disk.

In the specification provided here, a number of specific details are set forth. However, it can be understood that embodiments of the present invention may be practiced without these specific details. In some examples, well-known methods, structures and techniques have not been shown in detail in order not to obscure the understanding of this specification.

In addition, those skilled in the art can understand that, although some embodiments described herein comprise some features comprised in other embodiments but not other features, the combination of features of different embodiments means falling within the scope of the present invention and forming different embodiments. For example, in the claims, any of the claimed embodiments may be used in any combination.

It should be understood by those skilled in the art that, although the present invention has been described with reference to the exemplary embodiments, various changes may be made, and equivalents may be substituted for elements thereof without departing from the scope of the present invention. In addition, many modifications may be made to adapt a particular condition or material to the teachings of the present invention without departing from the essential scope of the present invention. Therefore, the present invention is not limited to the specific embodiments disclosed, but includes all the embodiments falling within the scope of the appended claims.

What is claimed is:

1. A storage method of on-board data used for an on-board database, comprising:
    obtaining, in a current time period, various pieces of time sequence data to be processed written into the on-board database;
    for each piece of the time sequence data to be processed, determining a node to be stored in the on-board database and a partition to be stored in the node according to the piece of the time sequence data to be processed, and writing the piece of the time sequence data to be processed into a corresponding time sequence in the determined partition to be stored comprising: compressing each piece of the time sequence data to be processed respectively according to a time stamp difference and an index value difference between various pieces of the time sequence data to be processed and writing the compressed each piece of the time sequence data to be processed into a corresponding time sequence in a corresponding partition to be stored respectively; and
    writing each piece of the time sequence data written into each partition to be stored into each corresponding data bucket in memory respectively and merging the time sequence data in each data bucket in memory,
    wherein for each time stamp difference and each index value difference:
    a corresponding coding method is determined according to the time stamp difference and the index value difference;
    the time stamp difference or the index value difference is represented and stored by a first coding method in a case where the time stamp difference or the index value difference is greater than or equal to a first value and less than a second value; and
    the time stamp difference or the index value difference is represented and stored by a second coding method in a case where the time stamp difference or the index value difference is greater than or equal to the second value and less than a third value.

2. The storage method according to claim 1, wherein for each piece of the time sequence data to be processed, determining a node to be stored in the on-board database and a partition to be stored in the node according to the piece of the time sequence data to be processed, and writing the piece of the time sequence data to be processed into a corresponding time sequence in the determined partition to be stored comprises:
    for each piece of the time sequence data,
        determining a hash value corresponding to a key of the piece of the time sequence data to be processed; and
        determining the node to be stored corresponding to the piece of the time sequence data to be processed, the partition to be stored in the node to be stored and a corresponding time sequence of the partition to be stored according to the hash value, and writing the piece of the time sequence data to be processed into the corresponding time sequence in the partition to be stored.

3. The storage method according to claim 2, wherein writing each piece of the time sequence data written into each partition to be stored into each corresponding data bucket in memory respectively and merging the time sequence data in each data bucket in memory comprises:
    for each time sequence in each partition to be stored, writing each piece of the time sequence data written into the time sequence within the current time period into a data bucket in memory corresponding to the time sequence; and
    for each data bucket in memory, merging each piece of the time sequence data written into the data bucket in memory.

4. The storage method according to claim 1, wherein compressing each piece of the time sequence data to be processed respectively according to a time stamp difference and an index value difference between various pieces of the time sequence data to be processed comprises:
    for each partition to be stored:
    writing a first piece of time sequence data to be processed into the partition to be stored;
    determining a first time stamp difference and a first index value difference between a second piece of time sequence data to be processed and the first piece of time sequence data to be processed written into the partition to be stored, and storing the first time stamp difference and the first index value difference as a compressed second piece of time sequence data in the partition to be stored; and
    determining a second time stamp difference and a second index value difference between a third piece of time sequence data to be processed and the second piece of time sequence data to be processed written into the partition to be stored, determining a third time stamp difference between the second time stamp difference and the first time stamp difference and a third index value difference between the second index value difference and the first index value difference, and storing the third time stamp difference and the third index value difference as a compressed third piece of time sequence data in the partition to be stored.

5. A storage method of on-board data used for an on-board database, comprising:
    obtaining, in a current time period, various pieces of time sequence data to be processed written into the on-board database;
    for each piece of the time sequence data to be processed, determining a node to be stored in the on-board database and a partition to be stored in the node according to the piece of the time sequence data to be processed, and writing the piece of the time sequence data to be processed into a corresponding time sequence in the determined partition to be stored;
    writing each piece of the time sequence data written into each partition to be stored into each corresponding data bucket in memory respectively and merging the time sequence data in each data bucket in memory;
    determining merged time sequence data to be processed that is written into an on-board hard disk, wherein the merged time sequence data to be processed comprises the merged time sequence data in each data bucket in memory;
    writing the merged time sequence data to be processed into the on-board hard disk;
    determining time sequence data to be recorded comprising remaining time sequence data after the merged time sequence data in each data bucket in memory is written into the on-board hard disk and the remaining time sequence data of each time sequence in each partition to be stored;

recording log information of the time sequence data to be recorded, and determining whether the log information is written into the on-board hard disk and a writing frequency of the log information; and writing the log information into the on-board hard disk at the writing frequency in a case where it is determined that the log information is written into the on-board hard disk.

6. The storage method according to claim 5, wherein writing the merged time sequence data to be processed into the on-board hard disk comprises:

compressing the merged time sequence data to be processed into data blocks and writing each of the data blocks into the on-board hard disk.

7. The storage method according to claim 5, further comprising:

determining time sequence data to be deleted in the on-board hard disk according to a storage time; and deleting the time sequence data to be deleted to write the merged time sequence data to be processed into the on-board hard disk.

8. The storage method according to claim 5, wherein for each piece of the time sequence data to be processed, determining a node to be stored in the on-board database and a partition to be stored in the node according to the piece of the time sequence data to be processed, and writing the piece of the time sequence data to be processed into a corresponding time sequence in the determined partition to be stored comprises:

for each piece of the time sequence data, determining a hash value corresponding to a key of the piece of the time sequence data to be processed; and determining the node to be stored corresponding to the piece of the time sequence data to be processed, the partition to be stored in the node to be stored and a corresponding time sequence of the partition to be stored according to the hash value, and writing the piece of the time sequence data to be processed into the corresponding time sequence in the partition to be stored.

9. The storage method according to claim 5, further comprising:

determining summary data of each time sequence in each node to be stored; and storing the summary data of each time sequence according to a summary tree respectively to read the summary data of each time sequence from the memory, wherein the memory comprises various time sequences, various data buckets in memory and various summary trees, wherein each summary tree comprises a root node and multiple layers of nodes from top to bottom, each of which stores the summary data of a time sequence corresponding to the summary tree within a time interval.

10. A storage method of on-board data used for an on-board database, comprising:

obtaining, in a current time period, various pieces of time sequence data to be processed written into the on-board database;

for each piece of the time sequence data to be processed, determining a node to be stored in the on-board database and a partition to be stored in the node according to the piece of the time sequence data to be processed, and writing the piece of the time sequence data to be processed into a corresponding time sequence in the determined partition to be stored; and writing each piece of the time sequence data written into each partition to be stored into each corresponding data bucket in memory respectively and merging the time sequence data in each data bucket in memory;

determining summary data of each time sequence in each node to be stored;

storing the summary data of each time sequence according to a summary tree respectively to read the summary data of each time sequence from the memory, comprising, for the summary tree of each time sequence, for each node in an nth layer of the nodes, determining an mth time interval represented by the node, and storing the summary data of the time sequence data in the time sequence calculated within the mth time interval into the node, wherein the memory comprises various time sequences, various data buckets in memory and various summary trees; and writing each summary tree into an on-board hard disk to query the summary data of each time sequence from the on-board hard disk, wherein each summary tree comprises a root node and multiple layers of nodes from top to bottom, each of which stores the summary data of a time sequence corresponding to the summary tree within a time interval; and wherein a hard disk file corresponding to each summary tree comprises a tile header part and a data part, the file header part comprises a key of the time sequence corresponding to the summary tree and the time interval corresponding to each node of the summary tree, and the data part comprises the summary data stored by each node of the summary tree.

11. The storage method according to claim 10, wherein each node in each summary tree stores an offset from a start time of a parent node to a start time of a current node respectively, and a start time of a time interval represented by the current node is determined by the start time of the parent node and the offset from the start time of the parent node to the start time of the current node.

12. The storage method according to claim 10, further comprising:

determining a time interval to be queried and a key of the time sequence corresponding to summary data to be queried;

searching the hard disk file corresponding to the summary data to be queried from the on-board hard disk according to the key of the time sequence corresponding to the summary data to be queried;

loading the summary tree corresponding to the summary data to be queried from the hard disk file; and matching from a parent node of the summary tree corresponding to the summary data to be queried, traversing multiple layers of nodes of the summary tree corresponding to the summary data to be queried layer by layer until one or more nodes corresponding to the time interval to be queried are found to obtain the summary data from one or more nodes corresponding to the time interval to be queried.

13. The storage method according to claim 12, wherein:

obtaining the summary data from one or more nodes corresponding to the time interval to be queried comprises:

obtaining the summary data of a node in a layer of nodes in the summary tree corresponding to the summary data to be queried, and taking the summary data of the node in the layer of nodes as a query result in a case that the time interval to be queried comprises one node; and obtaining the summary data of a plurality of nodes in a layer of nodes in the summary tree corresponding to the summary data to be queried respectively, and merging the summary data of the plurality of nodes in a case that the time interval to be queried comprises the plurality of nodes, wherein the merged summary data is taken as the query result.

14. The storage method according to claim 12, wherein obtaining the summary data from one or more nodes corresponding to the time interval to be queried comprises:

discarding the summary data of an upper boundary node and a lower boundary node in a layer of nodes of the summary tree corresponding to the summary data to be queried, and retaining the summary data of nodes other than the upper boundary node and the lower boundary node in the layer of nodes of the summary tree corresponding to the summary data to be queried in a case that the time to be queried does not completely cover the nodes in the layer of nodes of the summary tree corresponding to the summary data to be queried.

15. An electronic device, comprising:
a memory; and
a processor coupled to the memory, wherein the memory is configured to store one or more computer instructions that are executed by the processor to implement the storage method according to claim 1.

16. A non-transitory computer readable storage medium having a computer program stored thereon, wherein the computer program is executed by a processor to implement the storage method according to claim 1.

17. An electronic device, comprising:
a non-transitory memory; and
a processor coupled to the memory, wherein the memory is configured to store one or more computer instructions that are executed by the processor to implement the storage method according to claim 5.

18. A non-transitory computer readable storage medium having a computer program stored thereon, wherein the computer program is executed by a processor to implement the storage method according to claim 5.

19. An electronic device, comprising:
a non-transitory memory; and
a processor coupled to the memory, wherein the memory is configured to store one or more computer instructions that are executed by the processor to implement the storage method according to claim 10.

20. A non-transitory computer readable storage medium having a computer program stored thereon, wherein the computer program is executed by a processor to implement the storage method according to claim 10.

* * * * *